(12) United States Patent
Jin (10) Patent No.: US 11,742,355 B2
(45) Date of Patent: Aug. 29, 2023

(54) SEMICONDUCTOR STRUCTURE (71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/847,728

(22) Filed: Jun. 23, 2022

(65) Prior Publication Data
US 2022/0328484 A1  Oct. 13, 2022

Related U.S. Application Data (62) Division of application No. 17/249,495, filed on Mar. 3, 2021, now Pat. No. 11,437,378.

(30) Foreign Application Priority Data

Mar. 5, 2020 (CN) .......................... 202010147849.7

(51) Int. Cl.
*H01L 29/76* (2006.01)
*H01L 29/94* (2006.01)
*H01L 31/062* (2012.01)
*H01L 27/092* (2006.01)
*H01L 21/8234* (2006.01)
(Continued)

(52) U.S. Cl.
CPC .. *H01L 27/0924* (2013.01); *H01L 21/823431* (2013.01); *H01L 29/0649* (2013.01); *H01L 29/66795* (2013.01); *H01L 29/7851* (2013.01)

(58) Field of Classification Search
CPC ......... H01L 27/0924; H01L 21/823431; H01L 29/0649; H01L 29/66795; H01L 29/7851; H01L 29/401; H01L 21/823807; H01L 21/76898; H01L 21/823821;
(Continued)

(56) References Cited

U.S. PATENT DOCUMENTS

6,258,707 B1 * 7/2001 Uzoh ................ H01L 21/76877
257/E21.585
11,552,077 B2 * 1/2023 Bergendahl ..... H01L 21/823431
(Continued)

*Primary Examiner* — Theresa T Doan
(74) *Attorney, Agent, or Firm* — Anova Law Group, PLLC (57) ABSTRACT A semiconductor structure is provided. The semiconductor structure including: a substrate, where the substrate includes a first region and a second region adjacent to the first region; a plurality of fins formed over the first region of the substrate; an isolation layer over the substrate between adjacent fins of the plurality of fins, where a top of the isolation layer is lower than a top surface of a fin of the plurality of fins, the isolation layer over the second region and the second region of the substrate together contain a power rail opening, and the substrate contains a through-hole at a bottom of the power rail opening; and a first metal layer in the power rail opening and the through-hole, where a back surface of the first metal layer is above a back surface of the substrate.

10 Claims, 9 Drawing Sheets (51) Int. Cl.
*H01L 29/06* (2006.01)
*H01L 29/78* (2006.01)
*H01L 29/66* (2006.01)

(58) Field of Classification Search
CPC ......... H01L 21/823871; H01L 23/5384; H01L 23/5386; H01L 23/544; H01L 27/092
USPC ........................................................ 257/288
See application file for complete search history.

(56) References Cited

U.S. PATENT DOCUMENTS

2017/0243947 A1  8/2017  Adusumilli et al.
2017/0352727 A1  12/2017  Cheng et al.

\* cited by examiner

SEMICONDUCTOR STRUCTURE

CROSS-REFERENCE TO RELATED APPLICATIONS

This application is a divisional of U.S. patent application Ser. No. 17/249,495, filed on Mar. 3, 2021, which claims the priority of Chinese patent application No. 202010147849.7, filed on Mar. 5, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of semiconductor manufacturing technology, semiconductor devices have been developing towards higher component density and higher integration degree. During the evolution of integrated circuits, as the size of a semiconductor device (e.g., the size of a smallest component) reduces, the complexity of integrated circuit processing and manufacturing increases.

A power rail is a low resistance connection used to supply power (e.g., $V_{SS}$, $V_{DD}$) to a standard cell in the integrated circuit. Due to the needs of continuous scaling of the standard cell, a buried power rail having a portion embedded in the substrate have been introduced into the standard cell. However, because the RC in the back-end process continues to increase with the further advancement of technology nodes, the buried power rail can no longer provide sufficient power support for the standard cell. Therefore, a power distribution structure needs to be formed on a back of a semiconductor wafer, to provide sufficient power support for the standard cell.

At present, forming the power distribution structure on the back of the semiconductor wafer often includes forming a via electrically connected to the power rail on the back of the wafer. However, when the via has a high aspect ratio, the alignment accuracy of the via and the power rail is low, and even the alignment cannot be achieved, which seriously affects the device performance of the semiconductor structure. The disclosed methods and device structures are directed to solve one or more problems set forth above and other problems.

BRIEF SUMMARY OF THE DISCLOSURE

One aspect of the present disclosure includes a method for forming a semiconductor structure. The method includes providing a substrate, where the substrate includes a first region and a second region adjacent to the first region; and forming a plurality of fins over the first region of the substrate. The method also includes forming an isolation layer over a front surface of the substrate, where a top of the isolation layer is lower than a top surface of a fin of the plurality of fins; and forming a power rail opening by etching the isolation layer over the second region and a first portion of the second region of the substrate in a thickness direction. In addition, the method includes forming a through-hole by etching a second portion of the substrate in the thickness direction along the power rail opening; and forming a first metal layer in the power rail opening and the through-hole. Further, the method includes thinning a back surface of the substrate until the first metal layer is exposed from the thinned back surface of the substrate; and back-etching the back surface of the substrate to enable a back surface of the first metal layer to be above the back surface of the substrate.

Optionally, after back-etching the back surface of the substrate to enable the back surface of the first metal layer to be above the back surface of the substrate, the method further includes forming a second metal layer on the back surface of the substrate, where the second metal layer is electrically connected to the first metal layer.

Optionally, forming the through-hole includes: forming a sacrificial layer in the power rail opening, where the sacrificial layer covers a surface of the isolation layer; forming a mask layer over the sacrificial layer, where the mask layer exposes a portion of the sacrificial layer over the power rail opening; using the mask layer as a mask, etching the sacrificial layer until the substrate at a bottom of the power rail opening is exposed; and continuously etching the second portion of the substrate in the thickness direction along the power rail opening to form the through-hole.

Optionally, the sacrificial layer is made of a material including a carbon-containing compound or a spin-coated oxide.

Optionally, a width of the through-hole in a direction parallel to an extension direction of the fin is greater than or equal to a width of the through-hole in a direction perpendicular to the extension direction of the fin.

Optionally, before forming the through-hole, the method further includes forming a power-rail-opening insulating layer on sidewall and bottom surfaces of the power rail opening.

Optionally, before forming the first metal layer, the method further includes forming a first insulating layer on a surface of the power-rail-opening insulating layer, and on sidewall and bottom surfaces of the through-hole.

Optionally, before forming the first metal layer, the method further includes forming a first insulating layer on a sidewall surface of the power rail opening, and on sidewall and bottom surfaces of the through-hole.

Optionally, the first insulating layer has a single-layer structure or a multi-layer structure.

Optionally, the method further includes back-etching a front surface of the first metal layer to enable the front surface of the first metal layer to be lower than the top surface of the fin.

Optionally, after back-etching the front surface of the first metal layer, the method further includes forming an interlayer dielectric layer over a front surface of the first metal layer; performing a chemical mechanical polishing process on the interlayer dielectric layer to enable a top of the interlayer dielectric layer to be coplanar with the top of the isolation layer; and back-etching the isolation layer and the interlayer dielectric layer, to enable the top of the isolation layer and the top of the interlayer dielectric layer to be lower than the top surface of the fin.

Optionally, the first metal layer is made of a material including copper, cobalt, tungsten, ruthenium, titanium, aluminum, magnesium, an intermetallic compound, titanium nitride, copper manganese, or a combination thereof.

Optionally, before thinning the back surface of the substrate, the method further includes providing a supporting substrate, where the front surface of the substrate is bonded to the supporting substrate.

Another aspect of the present disclosure includes a semiconductor structure. The semiconductor structure includes a substrate, where the substrate includes a first region and a second region adjacent to the first region; and a plurality of fins formed over the first region of the substrate. The semiconductor structure also includes an isolation layer over the substrate between adjacent fins of the plurality of fins. A top of the isolation layer is lower than a top surface of a fin of the plurality of fins. The isolation layer over the second region and the second region of the substrate together contain a power rail opening, and the substrate contains a through-hole at a bottom of the power rail opening. Further, the semiconductor structure includes a first metal layer in the power rail opening and the through-hole, where a back surface of the first metal layer is above a back surface of the substrate.

Optionally, the semiconductor structure further includes a second metal layer on the back surface of the substrate, where the second metal layer is electrically connected to the first metal layer.

Optionally, a width of the through-hole in a direction parallel to an extension direction of the fin is greater than or equal to a width of the through-hole in a direction perpendicular to the extension direction of the fin.

Optionally, a front surface of the first metal layer is lower than the top surface of the fin.

Optionally, the first metal layer is made of a material including copper, cobalt, tungsten, ruthenium, titanium, aluminum, magnesium, an intermetallic compound, titanium nitride, copper manganese, or a combination thereof.

Optionally, the semiconductor structure further includes a first insulating layer on a sidewall surface of the power rail opening, and on sidewall and bottom surfaces of the through-hole.

Optionally, the semiconductor structure further includes a power-rail-opening insulating layer on sidewall and bottom surfaces of the power rail opening.

The disclosed embodiments may have following beneficial effects. After forming the power rail opening, a portion of the substrate in a thickness direction may be etched along the power rail opening to form the through-hole. The first metal layer may be formed in the power rail opening and the through-hole. The back surface of the substrate may be thinned to expose the first metal layer from the back surface of the substrate. The back surface of the substrate may be back-etched to enable the back surface of the first metal layer to be above the back surface of the substrate.

On the one hand, the first metal layer in the through-hole may connect the first metal layer in the power rail opening and the back power distribution structure subsequently formed on the back of the substrate, which may provide sufficient power support for the semiconductor device. On the other hand, the back surface of the first metal layer may be above the back surface of the substrate. The first metal layer protruded from the back surface of the substrate may serve as an alignment reference to facilitate alignment. Therefore, a wire connected to the back surface of the first metal layer may be directly formed, which may improve the alignment accuracy of the back power distribution structure on the back of the substrate and the first metal layer, thereby improving the device performance of the semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
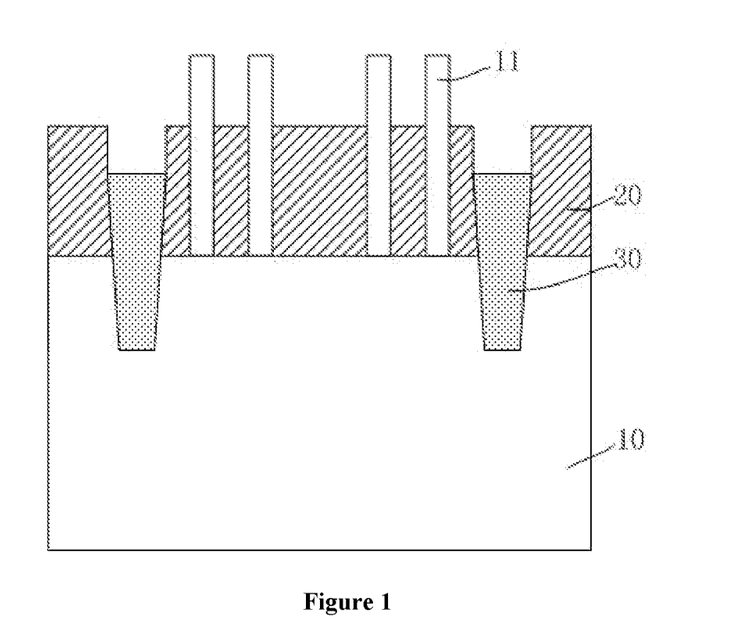
FIGS. 1-2 illustrate cross-sectional views of semiconductor structures corresponding to certain stages for forming a semiconductor structure.
Figure 2:
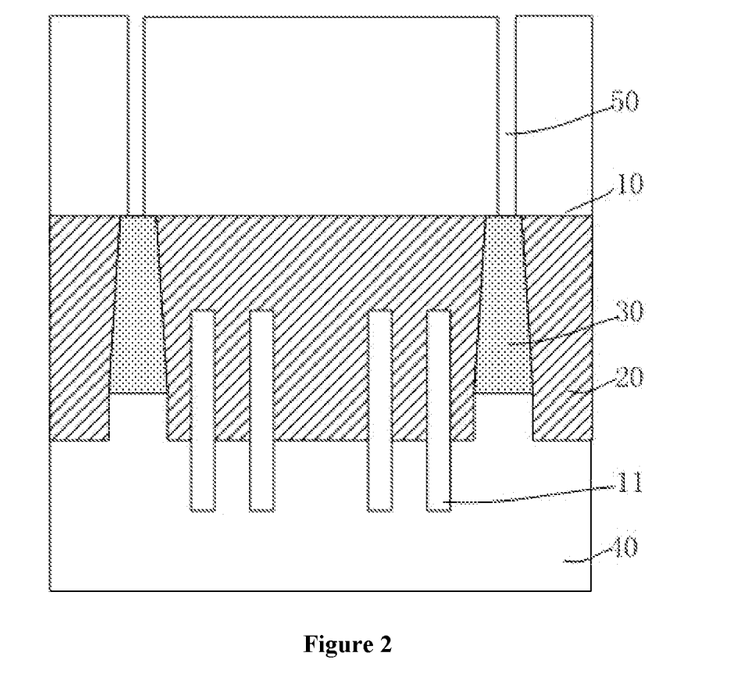

FIGS. 1-2 illustrate cross-sectional views of semiconductor structures corresponding to certain stages for forming a semiconductor structure. Referring to FIG. 1, a substrate 10 is provided, a fin 11 and an isolation layer 20 covering a portion of sidewall surface of the fin 11 and the surface of the substrate 10 are formed over the substrate. A power rail 30 is formed in the isolation layer 20 and the substrate 10, and a top of the power rail 30 is lower than a top surface of the fin 11.

Referring to FIG. 2, a carrier substrate 40 is provided, a front surface of the substrate 10 is bonded to the carrier substrate 40. The substrate 10 and the carrier substrate 40 are turned over to enable the carrier substrate 40 to support the substrate 10.

Referring to FIG. 2, the back of the substrate 10 is etched until a bottom surface of the power rail 30 is exposed to form a through-hole 50. A metal layer (not illustrated) is formed in the through-hole 50, and the metal layer is electrically connected to the power rail 30.

In the back power distribution structure formed by the above method, because the back of the substrate 10 does not have an alignment reference, when the to-be-formed through-hole has a high aspect ratio, the through-hole 50 formed by etching the back of the substrate cannot be well aligned with the position of the power rail, causing low alignment accuracy between the through-hole and the power rail, and even complete misalignment, which affects the connection structure in the semiconductor structure and the power supply performance of the power rail, and further leads to poor device performance of the semiconductor structure.

The present disclosure provides a semiconductor structure and a method for forming the semiconductor structure. After forming a power rail opening, a portion of the substrate along a thickness direction may continue to be etched to form a through-hole. A first metal layer may be formed in the power rail opening and the through-hole. The first metal layer in the through-hole may be configured to connect the power rail and a back power distribution structure subsequently formed on a back of the substrate. The back of the substrate may be thinned and back-etched, to enable a back surface of the first metal layer to be above the back surface of the substrate. When subsequently forming the back power distribution structure, the first metal layer may be configured as an alignment reference to facilitate alignment. A wiring structure connected to the first metal layer may be directly formed on the back of the substrate, which may improve the alignment accuracy and improve the device performance of the semiconductor structure.

Figure 16:
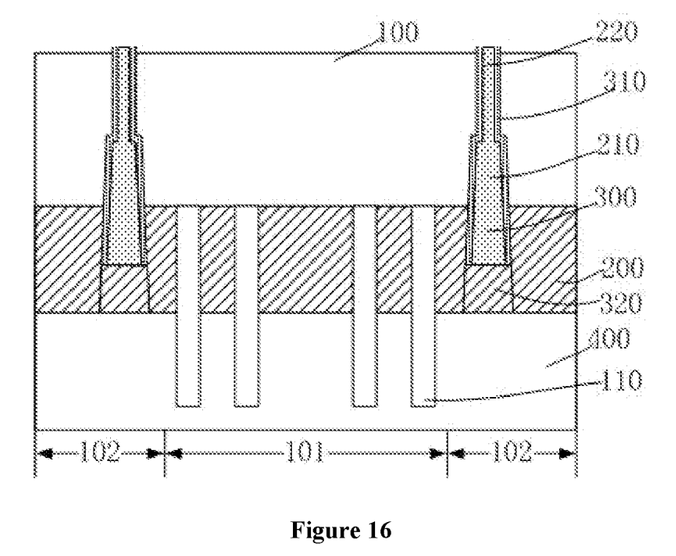
Figure 17:
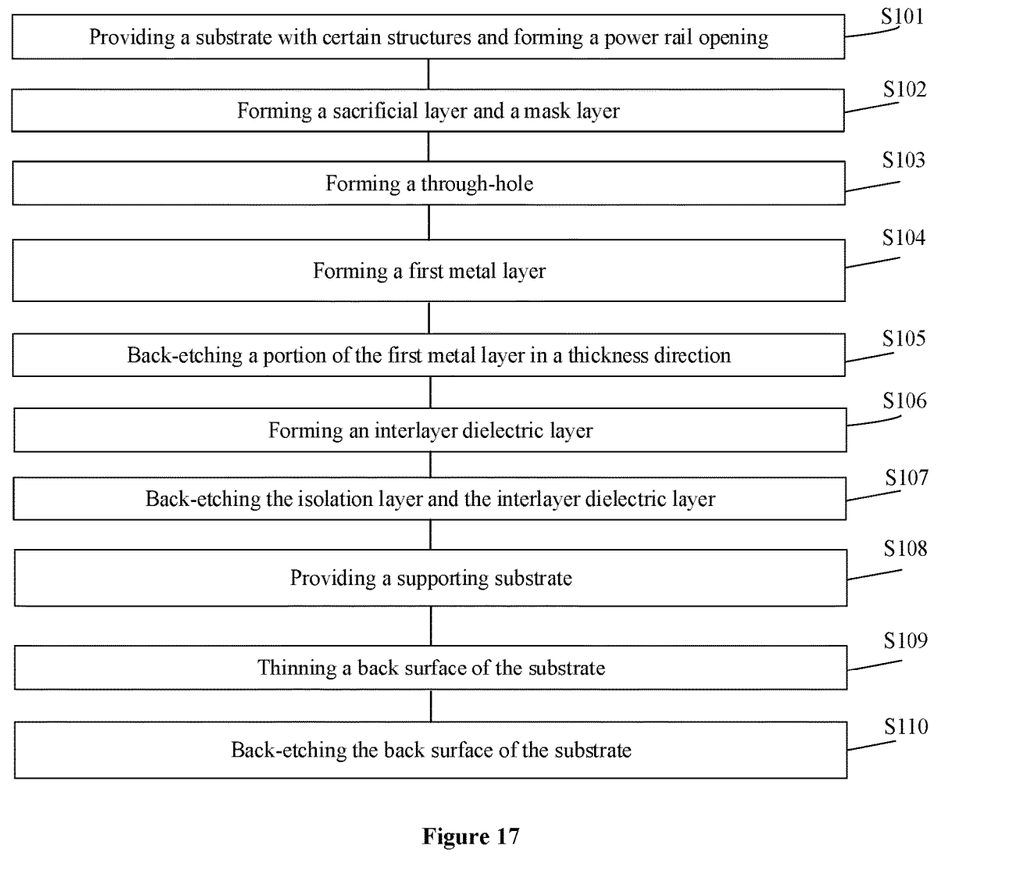
FIG. 17 illustrates a flowchart of an exemplary method for forming a semiconductor structure consistent with various disclosed embodiments of the present disclosure.

FIG. 17 illustrates a flowchart of a method for forming a semiconductor structure consistent with various disclosed embodiments of the present disclosure, and FIGS. 3-16 illustrate semiconductor structures corresponding to certain stages of the fabrication method.

Figure 3:
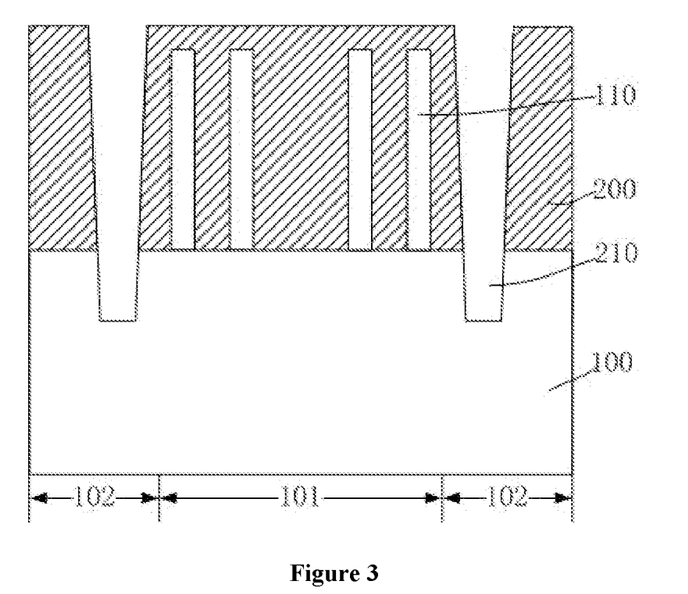
FIGS. 3-16 illustrate cross-sectional views of semiconductor structures corresponding to certain stages for forming an exemplary semiconductor structure consistent with various disclosed embodiments of the present disclosure.

As shown in FIG. 17, at the beginning of the fabrication method, a substrate with certain structures may be provided and a power rail opening may be formed (S101). FIG. 3 illustrates a corresponding semiconductor structure.

Referring to FIG. 3, a substrate 100 may be provided. The substrate 100 may include a first region 101 and a second region 102 that are adjacent to each other. A plurality of fins 110 may be formed over the first region 101 of the substrate 100. In one embodiment, a surface on which the fin 110 is formed may be a front surface of the substrate 100, and a surface on which the fin is not formed, i.e., a surface opposite to the front surface may be a back surface of the substrate 100. The substrate 100 may be configured to form PMOS, NMOS or CMOS.

In one embodiment, the substrate 100 may be a silicon substrate. In another embodiment, the substrate may be a germanium substrate, a silicon germanium substrate, a silicon carbide substrate, a silicon-on-insulator substrate, or a germanium-on-insulator substrate, etc.

In one embodiment, the fin 110 may be made of silicon. In another embodiment, the fin 110 may be made of germanium, or silicon germanium.

In one embodiment, forming the fin 110 over the first region 101 of the substrate 100 may include: forming a patterned layer (not illustrated) over the substrate 100, where the patterned layer may correspond to a position where the fin 110 needs to be formed over the first region 101 of the substrate 100; using the patterned layer as a mask, etching a portion of the first region 101 of the substrate 100 along a thickness direction to form the plurality of discretely arranged fins 110; and removing the patterned layer. The spacing between formed adjacent fins 110 may be same or different.

Referring to FIG. 3, an isolation layer 200 may be formed over the front surface of the first region 101 and the second region 102 of the substrate 100. A top of the isolation layer 200 may be above the top of the fin 110.

In one embodiment, the isolation layer 200 may be made of silicon dioxide. In another embodiment, the isolation layer 200 may be made of silicon oxynitride, or silicon nitride, etc.

In one embodiment, the isolation layer 200 may be configured to isolate the adjacent fins 110, to prevent subsequently occurred leakage, short-circuit, or any other phenomenon.

In one embodiment, forming the isolation layer 200 may include: depositing an isolation material film on the front surface of the first region 101 and the second region 102 of the substrate 100, where the isolation material film may cover the surface of the substrate 100, and the sidewall and top surfaces of the fin 110 over the first region 101; and planarizing the isolation material film to form the isolation layer 200.

In one embodiment, the isolation material film may be formed using a fluid chemical vapor deposition process, and, thus, the isolation material film may have desired filling performance.

Referring to FIG. 3, the isolation layer 200 over the second region 102 and a first portion of the second region 102 of the substrate 100 in a thickness direction may be etched to form a power rail opening 210.

In one embodiment, etching the isolation layer 200 and the first portion of the substrate 100 in the thickness direction may include a step etching. The isolation layer 200 over the second region 102 may be first etched until the surface of the substrate 100 is exposed, and then the first portion of the substrate 100 in the thickness direction may be etched to form the power rail opening 210.

After forming the power rail opening 210, a second portion of the substrate 100 in the thickness direction may be etched along the power rail opening to form a through-hole.

Figure 4:
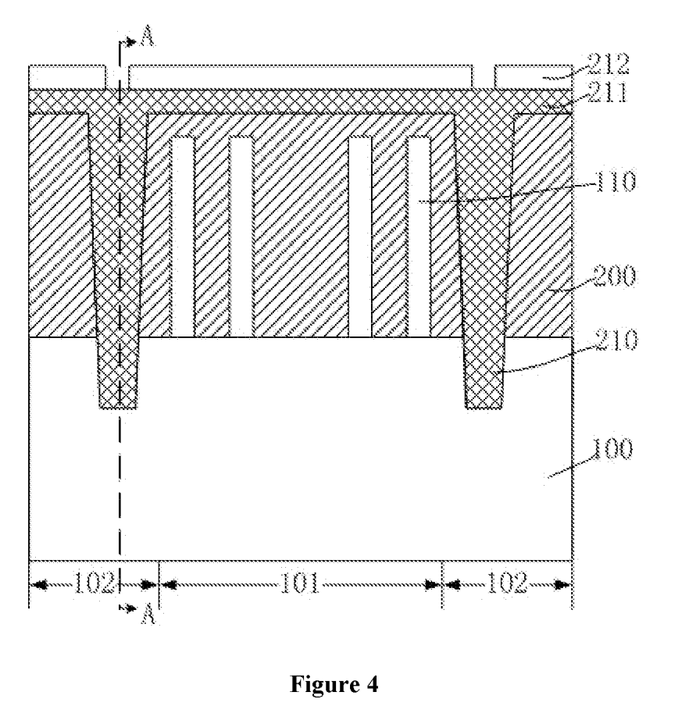

Returning to FIG. 17, after forming the power rail opening, a sacrificial layer and a mask layer may be formed (S102). FIG. 4 illustrates a corresponding semiconductor structure.

Referring to FIG. 4, a sacrificial layer 211 may be formed in the power rail opening 210, and the sacrificial layer 211 may cover a surface of the isolation layer 200.

In one embodiment, before forming the sacrificial layer 211, a power-rail-opening insulating layer may be formed on the sidewall and bottom surfaces of the power rail opening 210. In another embodiment, before forming the sacrificial layer 211, the power-rail-opening insulating layer may not be formed.

In one embodiment, the sacrificial layer 211 may be made of a carbon-containing compound. In another embodiment, the sacrificial layer 211 may be made of spin-coated oxide.

In one embodiment, forming the sacrificial layer 211 may include a spin coating method. In another embodiment, the sacrificial layer 211 may be formed by a chemical vapor deposition method.

Referring to FIG. 4, a mask layer 212 may be formed over the sacrificial layer 211, and the mask layer 212 may expose a portion of the sacrificial layer 211 over the power rail opening 210.

The mask layer 212 may be made of a material including one or more of photoresist, bottom anti-reflection layer, inorganic anti-reflection layer, silicon-containing anti-reflection layer, carbon-containing silicon oxide, and silicon nitride. In one embodiment, the mask layer 212 may be made of photoresist. In one embodiment, the mask layer 212 may be formed by a chemical vapor deposition method.

Figure 5:
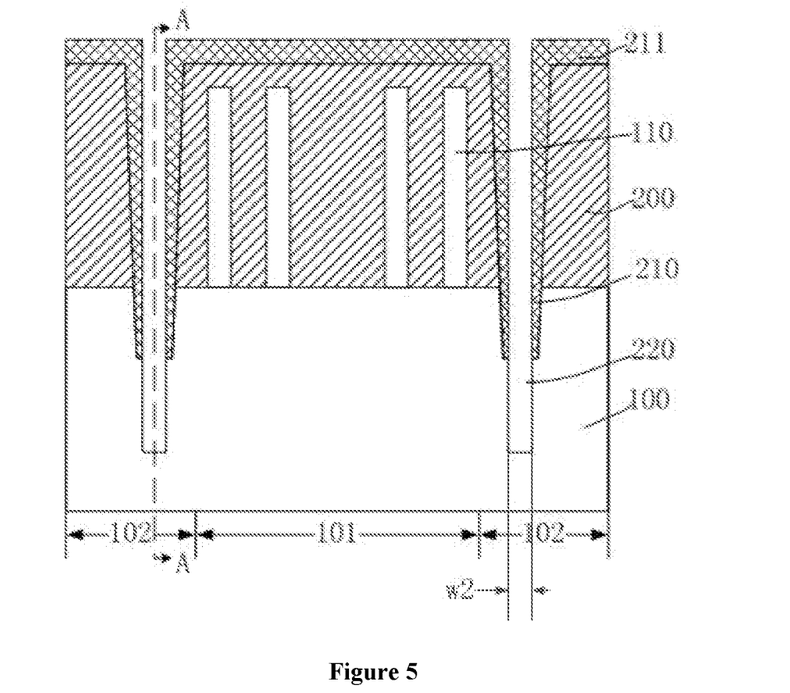

Returning to FIG. 17, after forming the mask layer, a through-hole may be formed (S103). FIG. 5 illustrates a corresponding semiconductor structure.

Referring to FIG. 5, using the mask layer 212 as a mask, the sacrificial layer 211 may be etched until the substrate 100 at the bottom of the power rail opening 210 is exposed. After the sacrificial layer 211 is etched, the mask layer 212 may be removed by an ashing process. In one embodiment, etching the sacrificial layer 211 may include a dry etching process, or a combination of a dry etching process and a wet etching process.

Referring to FIG. 5, a second portion of the substrate 100 in the thickness direction may be etched along the power rail opening 210 to form a through-hole 220. In one embodiment, etching the substrate 100 may include one or more of a dry etching process and a wet etching process.

In one embodiment, the sacrificial layer 211 may be formed in the power rail opening 210, and then the through-hole 220 may be formed by etching. The sacrificial layer 211 may serve as an alignment reference and facilitate alignment. Therefore, the formed through-hole 220 may be aligned with the power rail opening 210.

In one embodiment, a thickness of the etched second portion of the substrate 100 may be in a range of approximately 4000 Å-15000 Å. The specific thickness of the etched second portion of the substrate 100 may be selected according to actual process requirements.

Figure 6:
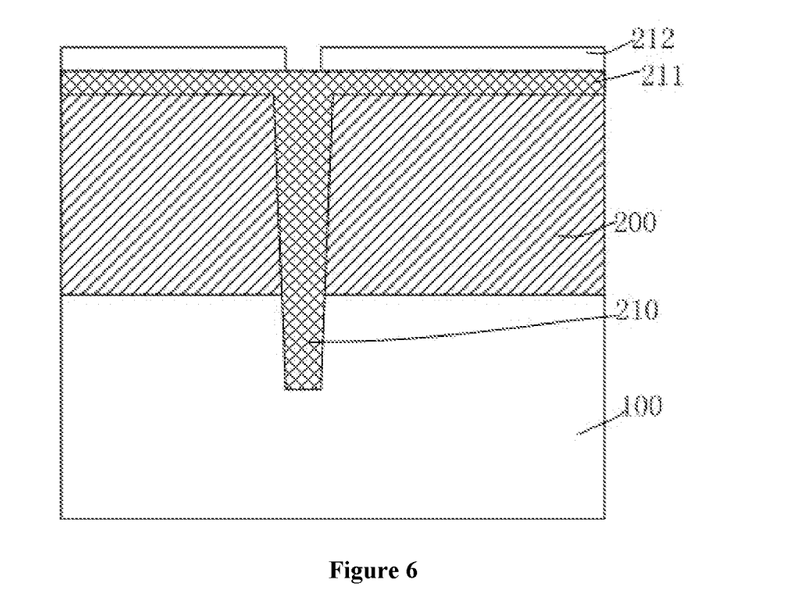
Figure 7:
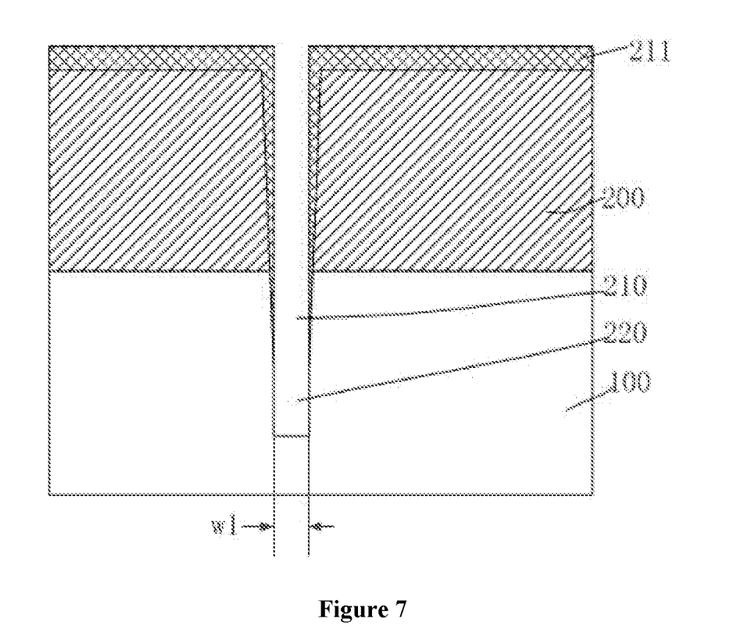

FIG. 6 illustrates an AA-sectional view of the structure in FIG. 4, and FIG. 7 illustrates an AA-sectional view of the structure in FIG. 5.

Referring to FIG. 7 and FIG. 5, in one embodiment, a width w1 of the through-hole 220 in a direction parallel to an extension direction of the fin 110 may be greater than a width w2 of the through-hole 220 in a direction perpendicular to the extension direction of the fin 110.

Because in the direction perpendicular to the extension direction of the fin 110, the space for forming the through-hole 220 may be insufficient, and the width of the formed through-hole 220 may be substantially narrow. After the through-hole is subsequently filled with a first metal layer, the conductive performance of the first metal layer in the through-hole 220 may be affected. Therefore, the width of the through-hole 220 in the direction parallel to the extension direction of the fin 110 may be appropriately widened to improve the conductive performance of the first metal layer in the through-hole 220, thereby improving the device performance of the semiconductor structure.

In certain embodiments, the width of the through-hole 220 in the direction parallel to the extension direction of the fin 110 may be equal to the width of the through-hole 220 in the direction perpendicular to the extension direction of the fin 110.

Figure 8:
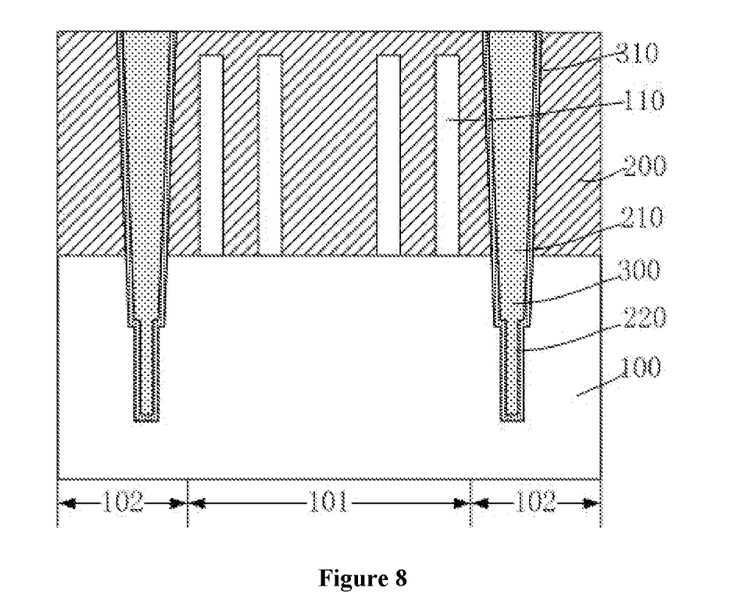

Returning to FIG. 17, after forming the through-hole, a first metal layer may be formed (S104). FIG. 8 illustrates a corresponding semiconductor structure.

Referring to FIG. 8, in one embodiment, after forming the through-hole 220, the sacrificial layer 211 may be removed by an ashing process. After forming the through-hole 220, a first metal layer 300 may be formed in the power rail opening 210 and the through-hole 220.

Referring to FIG. 8, in one embodiment, before forming the first metal layer, a first insulating layer 310 may be formed on the sidewall surface of the power rail opening 210, and on the sidewall and bottom surfaces of the through-hole 220.

The first insulating layer 310 may be configured to isolate the first metal layer from the substrate 100 and the isolation layer 200. The first insulating layer 310 may be made of nitride (e.g., silicon nitride) or oxide.

Forming the first insulating layer 310 may include a chemical vapor deposition method, or an atomic layer deposition method. In one embodiment, the first insulating layer 310 may have a single-layer structure. In another embodiment, the first insulating layer may have a multilayer structure.

In certain embodiments, before forming the sacrificial layer 211, a power-rail-opening insulating layer may be formed on the sidewall of the power rail opening 210. After forming the through-hole and before forming the first metal layer, the first insulating layer may be formed on the surface of the power-rail-opening insulating layer and on the sidewall and bottom surfaces of the through-hole 220.

In one embodiment, referring to FIG. 8, forming the first metal layer may include: fully filling the power rail opening 210 and the through-hole 220 with a first metal film (not illustrated), where the first metal film may cover the surface of the isolation layer 200; and performing a chemical mechanical polishing process on the first metal film until the top of the first metal film is coplanar with the top surface of the isolation layer 200, to form the first metal layer 300. In one embodiment, filling the first metal material film may include an electrochemical plating method.

In one embodiment, the first metal layer may be made of ruthenium. In another embodiment, the first metal layer may be made of copper, cobalt, tungsten, titanium, aluminum, magnesium, or an intermetallic compound thereof. In certain embodiments, the first metal layer may be made of titanium nitride, copper manganese, or any other conductive material. The intermetallic compound may include a copper-titanium intermetallic compound formed by copper and titanium, or an aluminum-titanium intermetallic compound formed by aluminum and titanium, etc.

Figure 9:
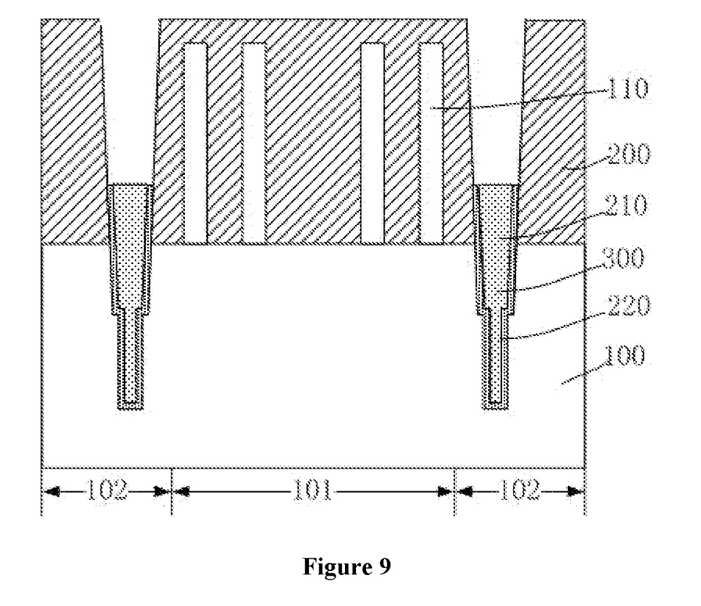
Figure 10:
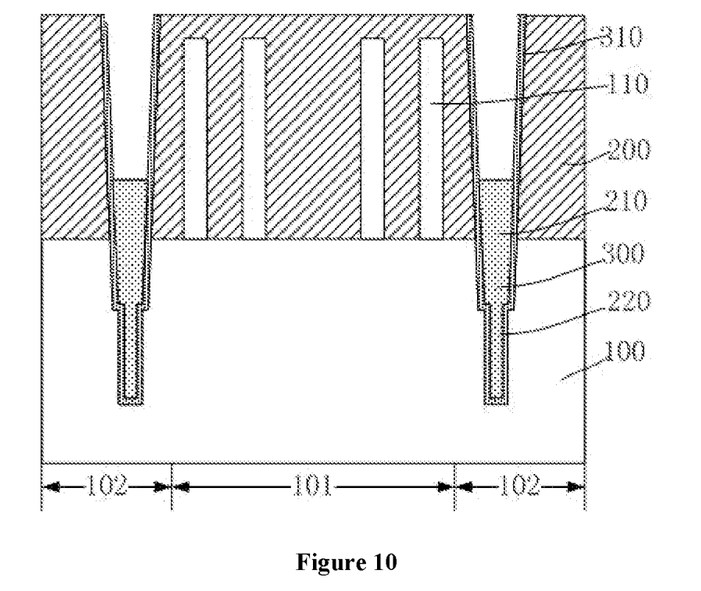

Returning to FIG. 17, after forming the first metal layer, a portion of the first metal layer in a thickness direction may be back-etched (S105). FIG. 9 illustrates a corresponding semiconductor structure.

Referring to FIG. 9, a portion of the first metal layer 300 in a thickness direction may be back-etched from the front surface to enable the front surface of the first metal layer 300 to be lower than the top surface of the fin 110.

In one embodiment, back-etching the first metal layer 300 may include one or more of a dry etching process and a wet etching process.

In one embodiment, the first metal layer 300 in the power rail opening 210 may serve as a power rail to supply power to the semiconductor structure. On the one hand, the first metal layer 300 in the through-hole 220 may serve as an alignment reference to improve the alignment accuracy of a subsequently formed wiring structure connected to the first metal layer. On the other hand, the first metal layer 300 may be configured to connect the power rail and a second metal layer subsequently formed on the back of the substrate 100, to form a back power distribution structure, thereby improving the power supply support for the semiconductor structure.

In one embodiment, after back-etching the first metal layer 300, the exposed first insulating layer 310 may be back-etched, to enable the top of the first insulating layer 310 to be coplanar with the top surface of the first metal layer 300. In certain embodiments, referring to FIG. 10, the first insulating layer 310 may be retained.

Figure 11:
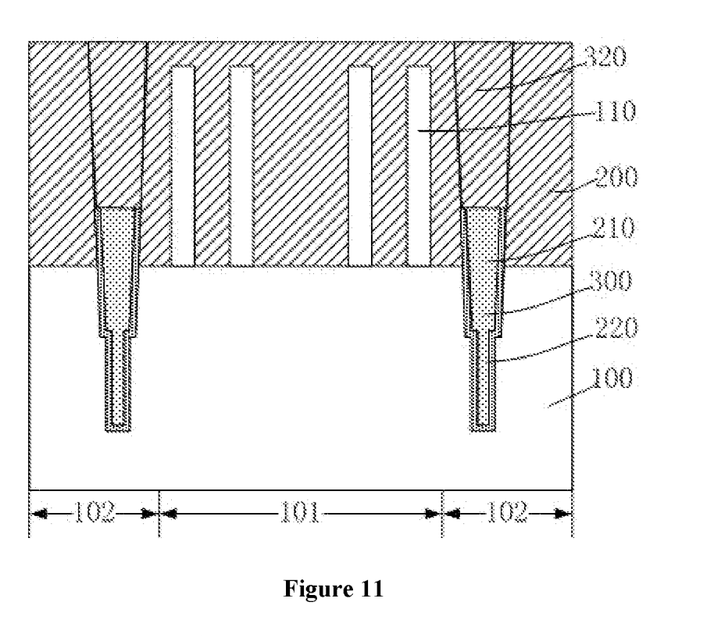

Returning to FIG. 17, after back-etching the first metal layer, an interlayer dielectric layer may be formed (S106). FIG. 11 illustrates a corresponding semiconductor structure.

Referring to FIG. 11, an interlayer dielectric layer 320 may be formed over the first metal layer 300, and the top of the interlayer dielectric layer 320 may be coplanar with the top of the isolation layer 200.

In one embodiment, the interlayer dielectric layer 320 may be made of silicon dioxide. In another embodiment, the interlayer dielectric layer 320 may be made of silicon oxynitride or silicon nitride.

In one embodiment, forming the interlayer dielectric layer 320 may include a chemical vapor deposition method. In another embodiment, the interlayer dielectric layer 320 may be formed by an atomic layer deposition method.

In one embodiment, because the interlayer dielectric layer 320 is made of the same material as the isolation layer 200, the interlayer dielectric layer 320 and the isolation layer 200 may together form a new isolation structure.

Figure 12:
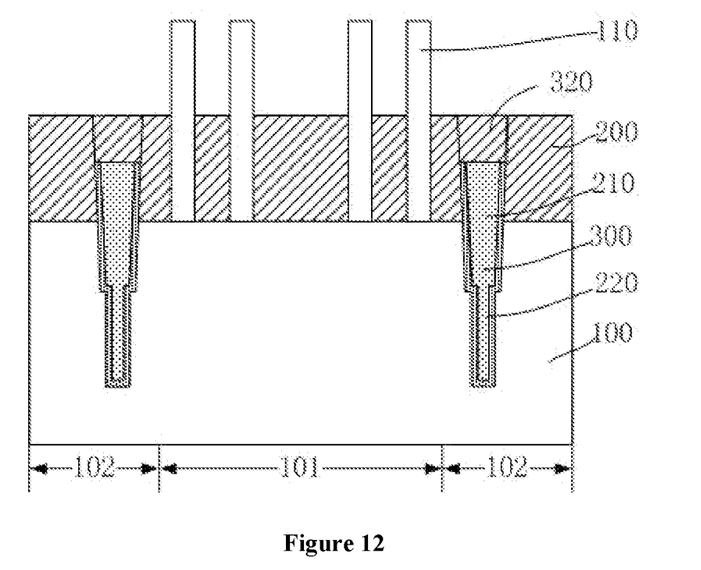

Returning to FIG. 17, after forming the interlayer dielectric layer, the isolation layer and the interlayer dielectric layer may be back-etched (S107). FIG. 12 illustrates a corresponding semiconductor structure.

Referring to FIG. 12, the isolation layer 200 and the interlayer dielectric layer 320 may be back-etched, to enable the top of the isolation layer 200 and the top of the interlayer dielectric layer 320 to be lower than the top surface of the fin 110.

In one embodiment, back-etching the isolation layer 200 and the interlayer dielectric layer 320 may include one or more of a dry etching process and a wet etching process.

Figure 13:
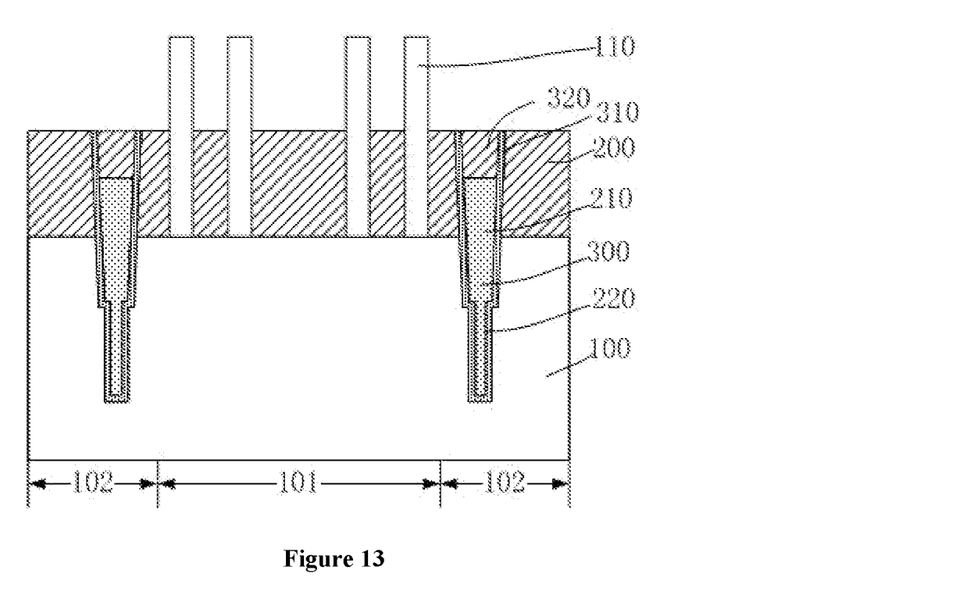

In certain embodiments, the first insulating layer 310 may be retained. Referring to FIG. 13, the sidewall of the interlayer dielectric layer 320 may further contain the first insulating layer 310.

In one embodiment, after back-etching the isolation layer 200 and the interlayer dielectric layer 320 to expose the top and a portion of the sidewall of the fin 110, the method may further include: forming a gate structure across the fin (not illustrated), and forming a wiring layer on the front surface of the substrate 100, etc. In one embodiment, forming the gate structure and the wiring layer may be a conventional process, which may not be repeated herein.

Figure 14:
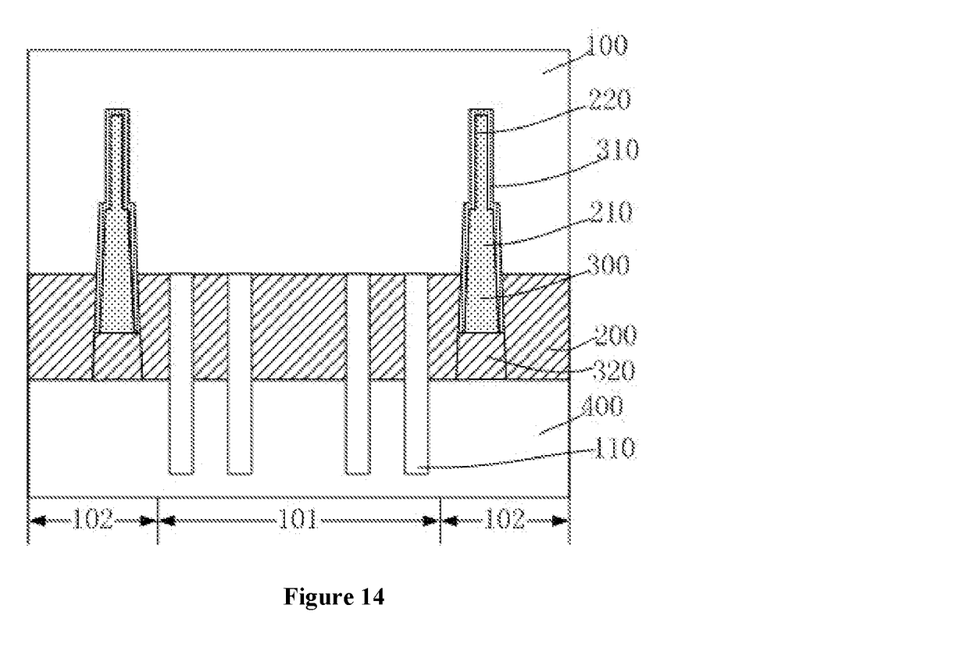

Returning to FIG. 17, after back-etching the isolation layer and the interlayer dielectric layer, a supporting substrate may be provided (S108). FIG. 14 illustrates a corresponding semiconductor structure.

Referring to FIG. 14, before thinning the back surface of the substrate 100, a supporting substrate 400 may be provided. The front surface of the substrate 100 may be bonded to the supporting substrate 400, and the substrate 100 and the supporting substrate 400 may be turned over, to enable the supporting substrate 400 to support the substrate 100, and to ensure the safety of the substrate 100 during the thinning process.

In one embodiment, the supporting substrate 400 may include a silicon substrate. In another embodiment, the supporting substrate may include a germanium substrate, a silicon germanium substrate, a silicon-on-insulator substrate, or a germanium-on-insulator substrate, etc.

Figure 15:
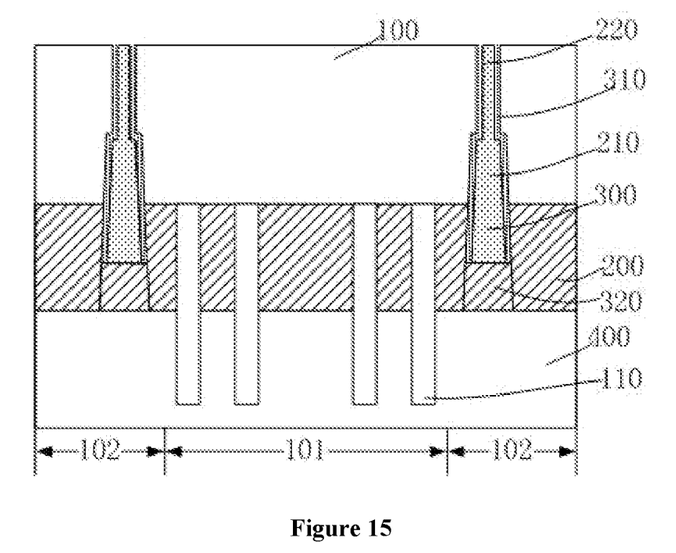

Returning to FIG. 17, after providing the supporting substrate, the back surface of the substrate may be thinned (S109). FIG. 15 illustrates a corresponding semiconductor structure.

Referring to FIG. 15, the back surface of the substrate 100 may be thinned until the first metal layer 300 is exposed from the back surface of the substrate 100. In one embodiment, the back surface of the substrate 100 may be thinned by a chemical mechanical polishing process.

Returning to FIG. 17, after thinning the back surface of the substrate, the back surface of the substrate may be back-etched (S110). FIG. 16 illustrates a corresponding semiconductor structure.

Referring to FIG. 16, the back surface of the substrate 100 may be back-etched, such that a back surface of the first metal layer 300 may be above the back surface of the substrate 100.

In one embodiment, the first metal layer 300 may be protruded from the back surface of the substrate 100. The first metal layer 300 may serve as an alignment reference to facilitate alignment when subsequently forming the second metal layer connected to the first metal layer 300. The second metal layer may be directly formed on the first metal layer 300, which may improve the alignment accuracy between the second metal layer and the first metal layer 300, and may avoid the issue that the electrical connection cannot be achieved due to misalignment. The formed back power distribution structure may enhance the power supply support of the semiconductor structure, and may improve the device performance of the semiconductor structure.

After back-etching the back surface of the substrate to enable the back surface of the first metal layer to be above the back surface of the substrate, the method may further include forming a second metal layer (not illustrated) on the back surface of the substrate 100. The second metal layer may be electrically connected to the first metal layer 300.

In one embodiment, the second metal layer may be made of ruthenium. In another embodiment, the second metal layer may be made of copper, cobalt, tungsten, titanium, aluminum, magnesium, or an intermetallic compound thereof. In certain embodiments, the second metal layer may be made of titanium nitride, copper manganese, or any other conductive material.

In one embodiment, the second metal layer connected to the first metal layer 300 may be formed on the back surface of the substrate 100, and a metal interconnection structure may be subsequently formed on the basis of the second metal layer, to form the power distribution structure on the back of the substrate 100, which may effectively solve the issue of insufficient power support due to the further increase of RC.

Correspondingly, the present disclosure also provides a semiconductor structure formed by any one of the above-disclosed methods.

Referring to FIG. 16, the semiconductor structure may include a substrate 100. The substrate 100 may include a first region 101 and a second region 102 that are adjacent to each other, and a plurality of fins 110 may be formed over the front surface of the first region 101 of the substrate 100. The semiconductor structure may also include an isolation layer 200 located over the substrate 100 between adjacent fins 110, and the top of the isolation layer 200 may be lower than the top surface of the fin 110. The second region 102 of the substrate 100 and the isolation layer 200 over the second region 102 may contain a power rail opening 210, and the substrate 100 below the power rail opening 210 may contain a through-hole 220. In addition, the semiconductor structure may include a first metal layer 300 located in the power rail opening 210 and the through-hole 220. The back surface of the first metal layer 300 may be above the back surface of the substrate 100.

In one embodiment, the first metal layer may be made of ruthenium. In another embodiment, the first metal layer may be made of copper, cobalt, tungsten, titanium, aluminum, magnesium, or an intermetallic compound thereof. In certain embodiments, the first metal layer may be made of titanium nitride, copper manganese, or any other conductive material.

The semiconductor structure may further include a second metal layer (not illustrated) located on the back surface of the substrate 100. The second metal layer may be electrically connected to the first metal layer 300.

In one embodiment, the second metal layer may be made of ruthenium. In another embodiment, the second metal layer may be made of copper, cobalt, tungsten, titanium, aluminum, magnesium, or an intermetallic compound thereof. In certain embodiments, the second metal layer may be made of titanium nitride, copper manganese, or any other conductive material.

Referring to FIG. 16, in one embodiment, the front surface of the first metal layer 300 may be lower than the top surface of the fin 110.

The disclosed embodiments may have following beneficial effects. After forming the power rail opening, a portion of the substrate in a thickness direction may be etched along the power rail opening to form the through-hole. The first metal layer may be formed in the power rail opening and the through-hole. The back surface of the substrate may be thinned to expose the first metal layer from the back surface of the substrate. The back surface of the substrate may be back-etched to enable the back surface of the first metal layer to be above the back surface of the substrate.

On the one hand, the first metal layer in the through-hole may connect the first metal layer in the power rail opening and the back power distribution structure subsequently formed on the back of the substrate, which may provide sufficient power support for the semiconductor device. On the other hand, the back surface of the first metal layer may be above the back surface of the substrate. The first metal layer protruded from the back surface of the substrate may serve as an alignment reference to facilitate alignment. Therefore, a wire connected to the back surface of the first metal layer may be directly formed, which may improve the alignment accuracy of the back power distribution structure on the back of the substrate and the first metal layer, thereby improving the device performance of the semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate, wherein the substrate includes a first region and a second region adjacent to the first region;
   a plurality of fins formed over the first region of the substrate;
   an isolation layer over the substrate between adjacent fins of the plurality of fins, wherein a top of the isolation layer is lower than a top surface of a fin of the plurality of fins, the isolation layer over the second region and the second region of the substrate together contain a power rail opening, and the substrate contains a through-hole at a bottom of the power rail opening; and
   a first metal layer in the power rail opening and the through-hole, wherein a back surface of the first metal layer is above a back surface of the substrate.

2. The semiconductor structure according to claim 1, further including:
   a second metal layer on the back surface of the substrate, wherein the second metal layer is electrically connected to the first metal layer.

3. The semiconductor structure according to claim 1, wherein:
   a width of the through-hole in a direction parallel to an extension direction of the fin is greater than or equal to a width of the through-hole in a direction perpendicular to the extension direction of the fin.

4. The semiconductor structure according to claim 1, wherein:
   a front surface of the first metal layer is lower than the top surface of the fin.

5. The semiconductor structure according to claim 1, wherein:
   the first metal layer is made of a material including copper, cobalt, tungsten, ruthenium, titanium, aluminum, magnesium, an intermetallic compound, titanium nitride, copper manganese, or a combination thereof.

6. The semiconductor structure according to claim 1, further including:
   a first insulating layer on a sidewall surface of the power rail opening, and on sidewall and bottom surfaces of the through-hole.

7. The semiconductor structure according to claim 6, wherein:
   the first insulating layer has a single-layer structure or a multi-layer structure.

8. The semiconductor structure according to claim 1, further including:
   a power-rail-opening insulating layer on sidewall and bottom surfaces of the power rail opening.

9. The semiconductor structure according to claim 1, further including:
   an interlayer dielectric layer formed over a front surface of the first metal layer in the isolation layer.

10. The semiconductor structure according to claim 9, wherein:
    the top of the isolation layer and a top of the interlayer dielectric layer are coplanar with each other.

* * * * *